United States Patent [19]

Agoston

[11] Patent Number: 4,659,946
[45] Date of Patent: Apr. 21, 1987

[54] MEMORY GATE FOR ERROR SAMPLER

[75] Inventor: Agoston Agoston, Beaverton, Oreg.

[73] Assignee: Tektronix, Inc., Beaverton, Oreg.

[21] Appl. No.: 851,859

[22] Filed: Apr. 14, 1986

[51] Int. Cl.[4] .................... H03K 17/16; G11C 27/02
[52] U.S. Cl. .................................. 307/353; 307/359; 307/572
[58] Field of Search ............... 307/353, 359, 572, 352; 328/151

[56] References Cited

U.S. PATENT DOCUMENTS 3,309,618  3/1967  Harris et al. ...................... 307/353
3,480,795  11/1969  Benson et al. ...................... 307/353

Primary Examiner—John Zazworsky
Attorney, Agent, or Firm—John Smith-Hill; Robert S. Hulse

[57] ABSTRACT

A memory gate for an error sampler comprises a memory capacitor having one terminal connected to a reference potential level. A current steering network has an input terminal at which it receives signal current and also has an output terminal connected to the other terminal of the memory capacitor. The current steering network either directs current received at its input terminal to its output terminal or diverts the current from the output terminal, depending on the relationship between the potential at a control terminal of the current steering network and the potential at the output terminal of the current steering network. The potential at the control terminal is biased to follow the potential at the output terminal of the current steering network, and therefore the amount by which the potential at the control terminal must be changed in order to change the state of the current steering network is independent of the voltage on the memory capacitor. A switch circuit is responsive to a gate control signal to place the current steering network in one or other of its states.

4 Claims, 2 Drawing Figures

MEMORY GATE FOR ERROR SAMPLER

This invention relates to a memory gate for an error sampler.

BACKGROUND OF THE INVENTION

As shown in FIG. 1, a conventional sampling head, for example as used in a digital oscilloscope, comprises a travelling wave sampler 2 which is connected to a signal input terminal 4 and receives strobe pulses from a strobe generator 6. The strobe generator generates strobe pulses in response to a strobe drive signal, and on each strobe pulse a sampling gate of the travelling wave sampler is rendered conductive and signal charge is allowed to accumulate on balanced delay lines of the sampler. At the end of the strobe pulse the sampling gate is rendered non-conductive and signal charge that accumulated on the delay lines is trapped. The signal charge that is trapped on the delay lines has a common mode component that is related to the voltage of the input signal, and the common mode charge is applied to an error amplifier 8. The output terminal of the amplifier 8 is connected to apply positive feedback to the bias network 10 for the sampler through a memory gate 12. The memory gate includes a memory capacitor and a switch that controls charging of the memory capacitor by the output signal of the amplifier 8 in dependence on the state of a gate control signal that it receives from the strobe generator 6. The gate control signal comprises a succession of gate control pulses, and the memory gate switch is conductive during each memory gate pulse. The leading edge of the memory gate pulse is synchronous with the strobe pulse. The positive feedback adjusts the level at which bias is applied to the sampler, so that immediately following each strobe pulse the amplifier 8 provides an output voltage that represents the difference between the input signal voltage at a sampling point and the input signal voltage at the previous sampling point. This output voltage is applied to the output terminal 14 of the sampling head. At the end of the memory gate pulse, the memory gate switch becomes non-conductive and breaks the positive feedback loop.

In the conventional memory gate, the memory gate switch responds to difference between the voltage of the gate control signal and the voltage stored on the memory gate capacitor, and accordingly the voltage amplitude of the memory gate pulse limits the dynamic range of the error signal that can be accurately transferred from the amplifier 8 to the output terminal 14 of the sampling head. Moreover, the duty cycle of the memory gate switch depends on the voltage on the memory gate capacitor, and this results in a non-linear transfer function relating the output voltage of the amplifier to the output voltage of the sampling head. Feedthrough of the gate control signal into the signal path influences the quantity of the charge stored on the memory gate capacitor.

SUMMARY OF THE INVENTION

In accordance with the present invention, a memory gate for an error sampler comprises a memory capacitor having one terminal connected to a reference potential level. A current steering network has an input terminal at which it receives signal current and also has an output terminal connected to the other terminal of the memory capacitor. The current steering network either directs current received at its input terminal to its output terminal or diverts the current from the output terminal, depending on the relationship between the potential at a control terminal of the current steering network and the potential at the output terminal of the current steering network. The potential at the control terminal is biased to follow the potential at the output terminal of the current steering network, and therefore the amount by which the potential at the control terminal must be changed in order to change the state of the current steering network is independent of the voltage on the memory capacitor. A switch circuit is responsive to a gate control signal to place the current steering network in one or other of its states.

BRIEF DESCRIPTION OF THE DRAWINGS

For a better understanding of the invention, and to show how the same may be carried into effect, reference will now be made, by way of example, to the accompanying drawings in which.

DETAILED DESCRIPTION

Figure 1:
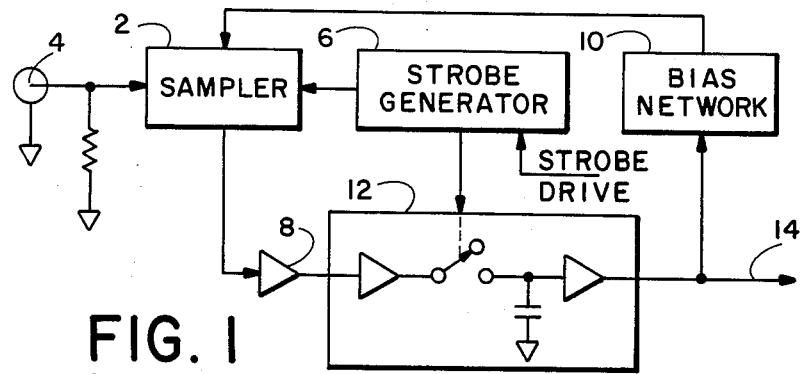
FIG. 1 is a simplified block diagram of a conventional sampling head.
Figure 2:
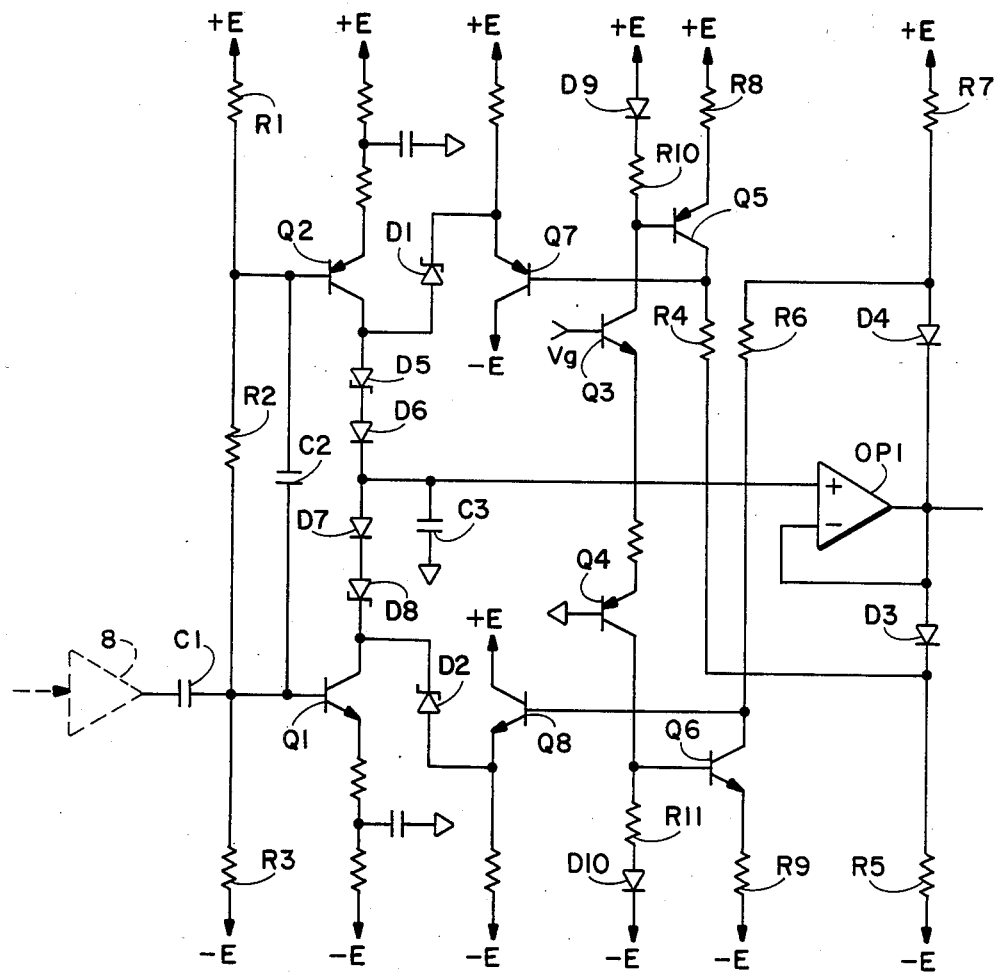
FIG. 2 is a schematic diagram of a memory gate circuit embodying the present invention.

The memory gate circuit illustrated in FIG. 2 receives the output signal from the amplifier 8 by way of an AC coupling capacitor C1. The alternating current component of the output signal of the amplifier 8 is applied to the base of a current source transistor Q1 and is applied through a decoupling capacitor C2 to the base of a current source transistor Q2. The bases of the transistors Q1 and Q2 are biased by a potential divider R1, R2 and R3 that is connected between positive and negative supply voltages $+E$ and $-E$. The emitters of the transistors Q1 and Q2 are connected to the negative and positive supply voltages respectively through separating resistors and are connected to ground through decoupling capacitors. When the current applied through the capacitor C1 to the base of the transistor Q1 decreases, the potential at the base of the transistor Q2 decreases and therefore the base current of the transistor Q2 increases. Therefore, the collector current of the transistor Q2 may be represented by $I_0+i_s(t)$, where $I_0$ is the bias current and $i_s(t)$ is the signal current, and the collector current of the transistor Q1 can be represented by $I_0-i_s(t)$. The collectors of the transistors Q1 and Q2 are connected to the input terminals of respective current steering networks, one of which comprises diodes D1, D5 and D6 and an emitter follower transistor Q7 and the other comprises diodes D2, D7 and D8 and an emitter follower transistor Q8. The bases of the transistor Q7 and Q8 serve as control terminals for the respective steering networks.

A transistor Q3 receives the gate control signal $V_g$ from a strobe generator. During the memory gate pulse, the voltage $V_g$ has a positive value $+V$; otherwise it has a negative value $-V$. When the voltage $V_g$ is negative, the transistors Q3, Q4 and the current source transistors Q5, Q6 are off. The resistors R4, R5 and R6, R7 supply base current to the emitter follower transistors Q7 and Q8 and therefore the diode switches D1 and D2 are on and collector current from the transistors Q2 and Q1 flows through the transistors Q7 and Q8 to the power supply. The output voltage of the FET input unity gain amplifier OP1 tracks the voltage on the memory capacitor C3. The output voltage of the amplifier OP1 is fed back through diodes D3 and D4 and resistors R4 and R6 to the bases of the transistors Q7 and Q8. The diodes D3 and D4 bias the transistors Q7 and Q8 so that their bases are, respectively, one diode drop below and one diode drop above the voltage on the memory capacitor C3. The offset between the voltage on the capacitor C3 and the voltages at the bases of the follower transistors Q7 and Q8 ensures that the range of voltages at the emitters of the transistors is sufficient to turn the diodes D1 and D2 fully on and off.

When the gate control voltage $V_g$ is equal to $+V$, the transistors Q3 and Q4 turn on. The transistors Q3 and Q4 supply base current to the current source transistors Q5 and Q6, turning these transistors on. The values of the resistors R8, R9 and R10, R11 associated with the transistors Q5 and Q6 are selected so that the collector current supplied by the current source transistors results in a change of two diode drops in the potential at the base of each of the follower transistors Q7 and Q8. The diodes D9 and D10 compensate for the base-emitter voltage drops in the transistors Q5 and Q6.

When the transistors Q5 and Q6 turn on, the switching diodes D1 and D2 turn off, and the bias current $I_0$ and the differential signal current $I_s(t)$ are injected into the memory capacitor C3 through the diodes D5–D8. When the gate control voltage $V_g$ goes negative once more, the circuit returns to the steady state.

Since the voltage on the memory capacitor C3 is applied, with one diode drop level shift, to the bases of the follower transistors Q7 and Q8, the change in voltage at the base of the transistor Q3 that is required to turn off the diodes D1 and D2, so as to steer current to the memory capacitor C3, is independent of the voltage on the memory capacitor. Consequently, the dynamic range of the memory gate circuit illustrated in FIG. 2 is improved relative to the conventional memory gate circuit. The duty cycle of the switching diodes D1 and D2 is independent of the voltage on the capacitor C3, and therefore the linearity of the FIG. 2 circuit is improved as compared with the conventional memory gate circuit. The gate control signal does not influence the charge stored on the capacitor C3 by feedthrough into the signal path.

In each pair of diodes D5, D6 and D7, D8, one diode is a high speed switching diode and the other diode, which may have a lower switching speed, is selected to have a low leakage current. The diodes D5 and D8 are Shottky barrier diodes and compensate for the voltage drop across the switching diodes D1 and D2 respectively. The diodes D6 and D7 are junction diodes and compensate for the base-emitter voltage drop across the follower transistors Q7 and Q8.

The memory gate circuit shown in FIG. 2 may be used in conjunction with the travelling wave sampler shown in co-pending application Ser. No. 845,900, filed March 28, 1986, the disclosure of which is hereby incorporated by reference herein.

It will be appreciated that the present invention is not restricted to the particular memory gate circuit that has been described and illustrated, and that variations may be made therein without departing from the scope of the invention as defined in the appended claims and equivalents thereof. In particular, numerous alternative circuit arrangements are available to persons skilled in the art for causing the base voltages of the transistors Q7 and Q8 to track the voltage on the memory capacitor C3 with sufficient offset to ensure that the switching diodes D1 and D2 will turn fully on and off.

I claim:

1. A memory gate for an error sampler, comprising a memory capacitor having a first terminal connected to a reference potential level and also having a second terminal, and current steering means having an input terminal for receiving current, an output terminal connected to the second terminal of the capacitor, and a control terminal, said current steering means having a first state in which the potential at the control terminal of the current steering means bears a first predetermined relationship with the potential at the output terminal and current received at the input terminal is delivered to the output terminal, and a second state in which the potential at the control terminal of the current steering means bears a second predetermined relationship to the potential at the output terminal and current received at the input terminal is diverted from the output terminal, and the memory gate also comprising follower means to bias the potential at the control terminal of the current steering means towards said first predetermined relationship with the potential at the output terminal of the current steering means, and switch means responsive to a gate control signal to place the potential at the control terminal in said second predetermined relationship with the potential at said output terminal.

2. A memory gate according to claim 1, wherein the current steering means comprise first and second diodes connected in series between the input terminal of the current steering means and the output terminal thereof, a transistor of which the base constitutes the control terminal of the current steering means, and a third diode connected between the input terminal of the current steering means and the emitter of the transistor, so that when the transistor receives base current the current received at the input terminal is diverted through the third diode to the collector of the transistor.

3. A memory gate according to claim 2, wherein the switch means comprise a second transistor having its base connected to recive the gate control signal and having its collector and emitter coupled to reference potential levels that are positive and negative respectively relative to the first-mentioned reference potential level, and a third transitor having its base, emitter and collector coupled respectively to the collector of the second transistor, the positive reference potential level, and the control terminal of the current steering means.

4. A memory gate according to claim 1, wherein the follower means comprise an amplifier having an input terminal connected to the second terminal of the memory capacitor and having an output terminal of which the potential follows the potential at the input terminal, a diode having its anode connected to the output terminal of the amplifier, and first and second resistors connecting the cathode of the diode to the control terminal of the current steering means and to a second reference potential level respectively, said second reference potential level being negative relative to the first-mentioned reference potential level.

* * * * *